United States Patent (10) Patent No.: US 7,495,205 B2
Lakanen et al. (45) Date of Patent: Feb. 24, 2009

(54) AUTOMATIC GAIN CONTROL IN PHOTODETECTORS

(75) Inventors: Robert Lakanen, Beaverton, OR (US); Baoliang Wang, Beaverton, OR (US)

(73) Assignee: Hinds Instruments, Inc., Hillsboro, OR (US)

( * ) Notice: Subject to any disclaimer, the term of this patent is extended or adjusted under 35 U.S.C. 154(b) by 0 days.

(21) Appl. No.: 11/752,225

(22) Filed: May 22, 2007

(65) Prior Publication Data

US 2008/0290257 A1 Nov. 27, 2008

(51) Int. Cl.
*H03G 3/20* (2006.01)
(52) U.S. Cl. ............................................... 250/214 AG

(58) Field of Classification Search ........... 250/214 AG, 250/207, 214 VT, 214 A
See application file for complete search history.

(56) References Cited

U.S. PATENT DOCUMENTS 3,714,441 A * 1/1973 Kreda ......................... 250/207
4,436,994 A * 3/1984 Van Vliet et al. ............. 250/207
5,726,438 A * 3/1998 Marchand .................... 250/207

\* cited by examiner

*Primary Examiner*—Thanh X Luu
(74) *Attorney, Agent, or Firm*—Hancock Hughley LLP

(57) ABSTRACT

The amount of gain applied to a photodetector such as a photomultiplier tube (PMT) is limited to an amount that does not cause the applied PMT bias voltage to overdrive, hence damage, the PMT. Techniques for limiting the PMT gain are implemented in a way that does not interfere with the precision with which the PMT gain may be established (by selection of a reference level) below that limited level.

10 Claims, 1 Drawing Sheet

US 7,495,205 B2

AUTOMATIC GAIN CONTROL IN PHOTODETECTORS

FIELD OF THE INVENTION

This invention relates to automatic gain control in photodetectors, such as those used in a variety of electro-optical applications.

BACKGROUND AND SUMMARY OF THE INVENTION

Circuits that employ an automatic gain control for controlling the gain of a photomultiplier tube (PMT) or similar photodetector are known in the prior art.

For example, the prior art circuit shown in FIG. 1 employs an operational amplifier (op-amp) 10 in a integrating configuration, where resistor R and capacitor C set the integration time constant as the product R*C seconds. The filtered DC portion of the PMT output signal 12 (hereafter referred to as "PMT output") is compared to a pre-selected DC reference 14. The output of the op-amp 10 is applied to the bias control 16 of the PMT, thereby to drive the PMT at a level such that the PMT output matches the DC reference. For example, if the level of the PMT output reaching the op-amp 10 is below the DC reference 14, the op-amp will provide to the PMT bias control 16 a signal for driving the PMT at a relatively higher level until the PMT output matches the DC reference.

A controller (not shown) monitors and conditions the signals directed to and from the op-amp 10. For example, in instances where the DC reference is user-selected, the system provides a user interface for receiving the selected input from the user, which input the controller converts as necessary to a corresponding DC reference level applied to the op-amp 10.

It is important that, despite the selected DC reference, the PMT gain be limited to an amount that does not cause the applied bias voltage to overdrive, hence damage, the PMT. Moreover, such techniques for limiting the PMT gain should not interfere with the precision with which the PMT output may be established (by selection of the DC reference) below that limited level.

DETAILED DESCRIPTION

Figure 1:
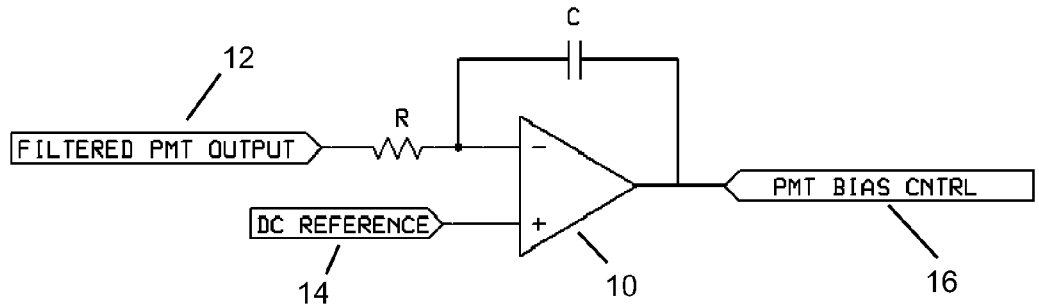
FIG. 1 a diagram of a prior art automatic gain control circuit for a photomultiplier tube (PMT).
Figure 2:
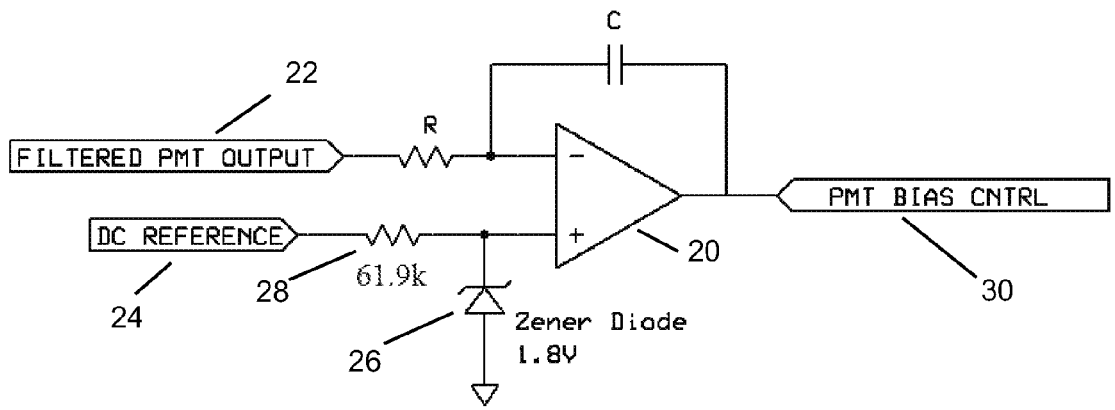
FIG. 2 is a diagram of a preferred embodiment of an automatic gain control for a PMT, including a mechanism for limiting the gain to a level less than that which would otherwise lead to overdriving, hence damaging, the PMT.

FIG. 2 is a diagram of a preferred embodiment of an automatic gain control for a PMT, including a mechanism for limiting the gain to a level less than that which would otherwise lead to overdriving, hence damaging, the PMT. The circuit of FIG. 2 includes an operational amplifier (op-amp) 20 in an integrating configuration. The filtered DC portion of the PMT output signal 22 (hereafter referred to as "PMT output") is applied to the negative input of the op-amp 20.

The selected DC reference voltage 24 is applied to the positive input of the op-amp 20. In this preferred configuration, however, a Zener diode 26 is interconnected between the op-amp 20 and DC reference 24, as shown in FIG. 2, with its anode terminal grounded. The Zener diode breakdown or Zener voltage is selected to establish the upper limit of voltage (here, the upper limit of the DC reference) that can be applied to the op-amp 20, hence limiting the bias voltage that can be applied to the PMT via the PMT bias control 30. In one embodiment the Zener voltage is 1.8 volts. Thus, if the DC reference 24 is selected to be above that amount, the Zener diode becomes conductive and shunts the DC reference voltage to ground, thereby preventing the undesirably high voltage from appearing at the positive input of the op-amp 20.

A resistor 28 (preferably 61.9 k Ohms in this embodiment) is located between the DC reference and the Zener diode 26 for protecting that diode from current levels that may damage the Zener diode itself.

In the preferred embodiment, the Zener voltage is relatively low. One can observe that, for such a low-voltage limit, the Zener diode will become conductive at voltage levels below the limit. Put another way, the Zener diode may become "leaky" at voltage levels approaching the established Zener voltage and thus prevent the application of the correct, selected DC reference voltage from reaching the op-amp, even though the selected DC reference voltage is less than the (Zener voltage) upper limit. The consequent lack of precision in applying the particularly selected DC reference voltage to the op-amp 20 for creating the sought-after gain of the PMT is unacceptable in many applications.

Figure 3:
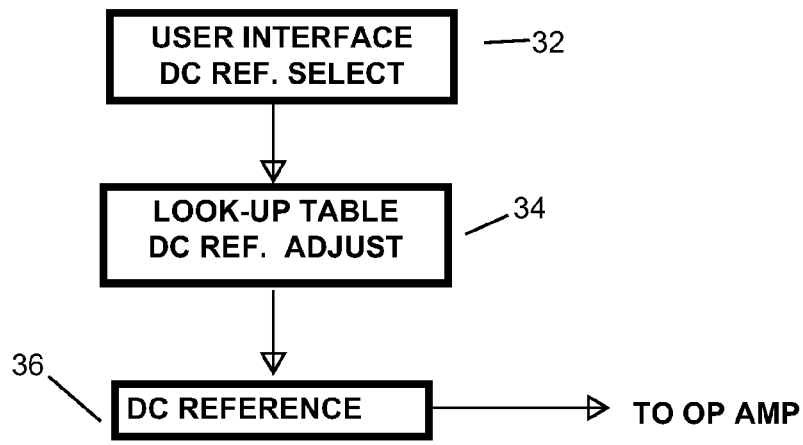
FIG. 3 is a flow diagram for illustrating an aspect of the invention that ensures precise selection of the DC reference voltage level.

Accordingly, as another aspect of the present invention, there is provided a technique that compensates for the voltage drop attributable to a "leaky" Zener diode effect explained above. To this end, voltage measurements are taken at the positive input of the op-amp and correlated to the selected DC reference voltage level. Numerous such measurements are taken at suitable increments of selected DC reference levels. The correlated data is stored as a look-up table for use by the controller for compensating for losses caused by the leaky Zener diode. This is explained in more detail next, with reference to the flow diagram of FIG. 3.

An implementation of the present invention may provide a user interface 32 whereby the user may select the desired PMT gain represented by the DC reference 36. It is noteworthy here that although a user-selected DC reference signal is discussed for this embodiment, it is also contemplated that other means for establishing the desired DC reference may be used, including automated methods based, for example, on changes in environmental conditions of the photodetectors of interest. In either case, the protection of the photodetectors and compensation for leaky Zener diodes is desired.

Once the user selects a DC reference value, the look-up table is consulted 34 to find the correlating voltage that is actually applied to the op-amp 20 as a result of the leaky Zener diode effect mentioned above. In instances where the actual and selected levels are unequal, the controller adjusts the DC reference 34 by the difference indicated in the look-up table so that the level applied to the op-amp 20 will match what the user selected for the desired gain of the PMT.

As noted, it is contemplated that the present invention is useful for automatic gain control of other types of photodetectors, such as avalanche photo-diodes. Also, other mechanisms for limiting the voltage applied to the op-amp may be used. For example, a resistor could be used in lieu of the Zener diode, with a corresponding look-up table developed and stored for use as discussed above.

The invention claimed is:

1. A method of controlling the level of gain applied to a photodetector, comprising the steps of:

providing means for establishing a selected level of gain;

providing a mechanism for limiting the level of gain applied to the photodetector irrespective of the selected level of gain; and compensating for differences between the selected level of gain and the level of gain applied to the photodetector, which differences being attributable to the mechanism.

2. The method of claim 1 wherein the compensating step includes constructing a lookup table reflecting differences between the selected level of gain and the level of gain applied to the photodetector.

3. The method of claim 2 wherein the compensating step includes adjusting the applied level of gain in accord with the look-up table.

4. The method of claim 1 including the step of protecting the mechanism from excessive current that would damage the mechanism.

5. An automatic gain control circuit for a photodetector, comprising:

a bias control for the photodetector;

an operational amplifier receiving an output from the photodetector and a reference level selection, the operational amplifier providing an output signal to the bias control representing an amount of bias to be applied to the photodetector;

a limit means for limiting the output from the reference level selection received by the operational amplifier to a predetermined maximum level; and means for establishing the reference level selection and for compensating for differences between the established reference level selection and the reference level selection received by the operational amplifier.

6. The circuit of claim 5 wherein the limit means includes a Zener diode.

7. The circuit for controlling the gain of a photodetector including:

a bias control for driving the photodetector;

a gain adjusting circuit connected to the bias control for providing to the bias control an output signal representing a comparison between an output of the photodetector and a selected level of gain, both the selected level of gain and the output being received as voltage inputs to the gain adjusting circuit;

a limit device for limiting the voltage level input corresponding to the selected level of gain, the limit device also reducing the voltage level input corresponding to the selected level of gain; and compensating means for compensating for the voltage level reductions attributable to the limiting device.

8. The circuit of claim 7 wherein the compensating means includes a stored look-up table and a controller for adjusting the selected level of gain in accord with the look-up table.

9. The circuit of claim 7 wherein the limit device is a Zener diode.

10. The circuit of claim 9 including a current protection device for limiting the level of current applied to the Zener diode.

* * * * *